(12) United States Patent
Fuechtner

(10) Patent No.: US 12,471,259 B2
(45) Date of Patent: Nov. 11, 2025

(54) COOLING ARRANGEMENT WITH COOLING FLUID CIRCUIT AND POWER ELECTRONICS

(71) Applicant: Dr. Ing. h.c. F. Porsche Aktiengesellschaft, Stuttgart (DE)

(72) Inventor: Martin Fuechtner, Stuttgart (DE)

(73) Assignee: DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 20 days.

(21) Appl. No.: 18/060,642

(22) Filed: Dec. 1, 2022

(65) Prior Publication Data
US 2023/0180445 A1 Jun. 8, 2023

(30) Foreign Application Priority Data
Dec. 2, 2021 (DE) .......................... 102021131736.3

(51) Int. Cl.
*H05K 7/20* (2006.01)
*H01L 23/44* (2006.01)

(52) U.S. Cl.
CPC .......... *H05K 7/20927* (2013.01); *H01L 23/44* (2013.01); *H05K 7/20236* (2013.01); *H05K 7/20263* (2013.01); *H05K 7/20272* (2013.01)

(58) Field of Classification Search
CPC ........... H05K 7/20218; H05K 7/20254; H05K 7/20263; H05K 7/20272; H05K 7/2039; H05K 7/20509; H05K 7/20845; H05K 7/20854; H05K 7/20872; H05K 7/2089; H05K 7/209; H05K 7/20927; H05K 2201/064; B60K 11/02; B60K 2001/003; H01G 2/08; H01H 9/52; H01L 23/473; H01L 23/34

See application file for complete search history.

(56) References Cited

U.S. PATENT DOCUMENTS

| | | | |
|---|---|---|---|
| 7,551,439 B2* | 6/2009 | Peugh | H01L 23/473 174/15.1 |
| 2012/0212907 A1* | 8/2012 | Dede | H01L 23/4735 361/689 |
| 2016/0023532 A1* | 1/2016 | Gauthier | H01M 10/6568 62/502 |
| 2019/0069450 A1* | 2/2019 | Suzuki | H02M 7/537 |

(Continued)

FOREIGN PATENT DOCUMENTS

| | | |
|---|---|---|
| DE | 102015220852 A1 | 4/2017 |
| DE | 102016218817 A1 | 3/2018 |
| DE | 102020104336 A1 | 8/2021 |

*Primary Examiner* — Jayprakash N Gandhi
*Assistant Examiner* — Steven Ngo
(74) *Attorney, Agent, or Firm* — LEYDIG, VOIT & MAYER, LTD.

(57) ABSTRACT

A cooling arrangement for cooling at least one power cell, in particular of a motor vehicle, includes a power cell and a cooling fluid circuit, wherein the power cell is directly electrically connected to at least one power conductor of an electric power supply, wherein a cooling fluid circulates in the cooling fluid circuit, wherein the cooling fluid circuit is fluidly connected to the power cell and/or the power conductor, and wherein the cooling fluid is a cooling medium having electrically insulating properties, in particular a dielectric medium.

15 Claims, 3 Drawing Sheets

(56) References Cited

U.S. PATENT DOCUMENTS

| | | |
|---|---|---|
| 2019/0111862 A1* | 4/2019 | Dede ................. H05K 7/20145 |
| 2021/0016625 A1 | 1/2021 | Lee et al. |
| 2021/0094441 A1* | 4/2021 | Sampson ................ B60K 1/02 |
| 2021/0094443 A1* | 4/2021 | Aikawa .................. B60L 58/26 |
| 2021/0305644 A1 | 9/2021 | Ernst et al. |
| 2022/0136775 A1* | 5/2022 | Wu .......................... G06F 1/20 |
| | | 165/104.25 |
| 2023/0124909 A1 | 4/2023 | Ngoc et al. |

* cited by examiner

COOLING ARRANGEMENT WITH COOLING FLUID CIRCUIT AND POWER ELECTRONICS

CROSS REFERENCE TO RELATED APPLICATIONS

This application claims benefit to German Patent Application No. DE 10 2021 131 736.3, filed on Dec. 2, 2021, which is hereby incorporated by reference herein.

FIELD

The invention relates to a cooling arrangement for cooling a power cell.

BACKGROUND

A power cell here is understood to mean a switching element and its cooling structure, e.g., configured by means of semiconductors, for switching high electrical powers, for example, in variable frequency drives or DC-DC converters.

In motor vehicles with an electric motor as the drive mover, high-voltage components are increasingly being used in order to provide the power required for driving the motor vehicle. Power electronics are used in order to drive the electric motor, the power cells of which must switch high electrical power outputs, thereby requiring the discharge of large amounts of dissipation power. Because this usually also must occur in a small design space, the dissipation power density per cooling element surface is very high. These components must be cooled accordingly. For high-performance vehicles in particular, this results in a conflict between the necessary thermal connection of the components for their cooling and the necessary electrical insulation of the components. Typically, the electrical components are connected to the cooling fluid circuit via an electrically insulating ceramic component. This results in the conflict of objectives between electrical insulation and thermal conductivity. The relatively low thermal conductivity of ceramic insulating bodies presents a disadvantage for the heat dissipation.

SUMMARY

In an embodiment, the present disclosure provides a cooling arrangement for cooling at least one power cell, in particular of a motor vehicle, comprising a power cell and a cooling fluid circuit, wherein the power cell is directly electrically connected to at least one power conductor of an electric power supply, wherein a cooling fluid circulates in the cooling fluid circuit, wherein the cooling fluid circuit is fluidly connected to the power cell and/or the power conductor, and wherein the cooling fluid is a cooling medium having electrically insulating properties, in particular a dielectric medium.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
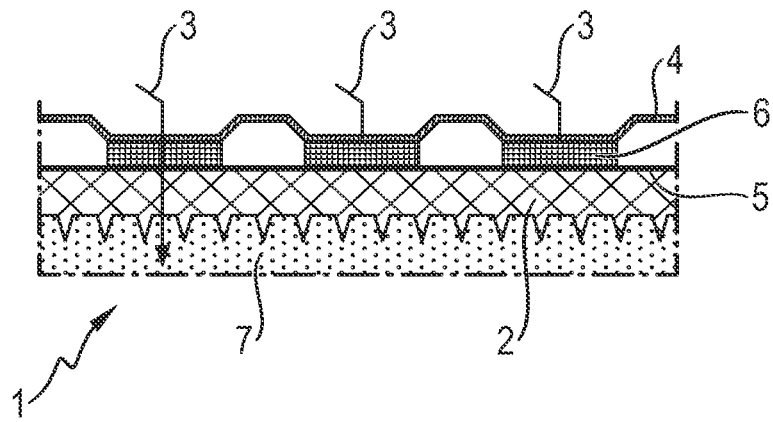
FIG. 1 shows a schematic partial sectional view of a power cell.

In an embodiment, the present invention creates a cooling arrangement that allows for an improved cooling of at least one power cell. An application in the high-voltage range, with voltages of more than 60V, can be provided. Alternatively, an application with voltages below 60V can also be provided.

An exemplary embodiment of the invention relates to a cooling arrangement for cooling at least one power cell, in particular of a motor vehicle, having a power cell and a cooling fluid circuit, wherein the power cell is directly electrically connected to at least one power conductor of an electric power supply, and wherein a cooling fluid circulates in the cooling fluid circuit, wherein the cooling fluid circuit is fluidly connected to the power cell and/or the power conductor, wherein the cooling fluid has electrically insulating properties and is in particular a dielectric medium. As a result, an improved thermal connection of the power cell to the power conductor can adopt the function of a heat sink, wherein the electrical insulation is carried out by the cooling fluid, which has electrically insulating properties and is in particular configured as a dielectric medium. Thus, a good thermal connection in order to improve cooling and a secure electrical insulation are achieved.

In an advantageous embodiment, it is also expedient when the cooling fluid circuit comprises cooling fluid lines, wherein the at least one power conductor is spaced apart from a cooling fluid line, wherein, between the power conductor and the cooling fluid line, there is a perfusable gap for electrical insulation between the power conductor and the cooling fluid line, through which the cooling fluid flows. As a result, the cooling fluid can be placed directly such that a flow occurs where cooling is desired. This can be particularly advantageously and optionally carried out by means of plastic cooling fluid lines.

It is also advantageous when the power conductor forms a heat sink for at least one incorporated switching element of the power cell. In that the power conductor forms a heat sink for the incorporated switching, it is advantageously achieved that, in the case of a semiconductor element such as those used in power cells of inverters, for example, and which generate high power dissipations in a very small space with extreme thermal power density, a thermal mass expansion and a surface expansion are achieved. This is achieved in the present concept by the power conductor directly connected metallically to the semiconductor element, so that the thermal needle tube can thereby still be omitted from the semiconductor or ceramic connection to the heat sink by means of thermal conductive paste.

It is also advantageous for the cooling fluid to flow over and/or through the power cell and/or at least one other component to be cooled. In the case of flowing over, the overflowed surface or the overflowed part is thereby well cooled. If the respective component, i.e., the power cell and/or the at least one other component to be cooled, is also perfused by the cooling fluid, then cooling can also be carried out inside the respective component to be perfused, in particular the power cell and/or the at least one other component to be cooled, which can prove particularly effective.

In a further exemplary embodiment, it is also expedient when at least one fluid path is provided in the power cell and/or in the at least one other component to be cooled, which is perfusable by the cooling fluid. In doing so, a very favorable type of thermal cooling can be carried out, also inside the component and/or the power cell.

It is advantageous for the fluid path to follow the electrical power path of the power cell and/or the at least one other component. In doing so, the cooling can be performed along the electrical power path, which is advantageous.

It is also expedient when the power cell is a power electronics, in particular an inverter or the like, wherein the optional at least one other component to be cooled is, for example, an electric motor and/or a high-voltage battery. Thus, preferably individual or all components in an electrically driven drive train can be cooled accordingly.

It is advantageous when the cooling fluid circuit forms a circuit or forms a plurality of circuits that are thermally and/or fluidly coupled to one another. When selecting a circuit, the wiring is relatively simple, which is favorable in terms of design and manufacture. When selecting multiple circuits, the cooling fluid can be divided between different components and power cells so that they are temperable with a cooling fluid having a suitable temperature in order to reach the optimum temperature of the power cell or component, respectively. The order of the arrangement of the power cell or components can also be selected appropriately in order to reach the optimal temperatures.

It is also advantageous when the cooling fluid circuit in the one circuit or in at least one of the circuits comprises a pump, a first heat exchanger as a radiator for the cooling fluid, and optionally a reservoir, a dryer, and/or a separator, in particular for undesirable substances within the cooling circuit. By providing the pump, the fluid flow is generated in the cooling fluid circuit. The radiator causes a cooling of the cooling fluid after it has been heated by the power cell and/or the components to be cooled. The reservoir tank is used in order to compensate for volume fluctuations, for example due to temperature changes, but also with respect to leakage losses. The dryer is advantageously provided in order to bind any ingress of water so as to maintain the dielectric properties of the cooling fluid. The separator can also separate water or other contaminants in order to maintain the dielectric properties of the cooling fluid.

In a further exemplary embodiment, it is also advantageous when the power cell and/or the at least one further component(s) to be cooled are fluidly connected serially and/or parallel to one another in the at least one circuit. In this way, as well, the arrangement of the power cell and components can be optimized with respect to the temperature and the required cooling capacity.

In a further exemplary embodiment, it is also advantageous when the thermally coupled circuits are coupled by means of a second heat exchanger. In doing so, a separation of media can be carried out so that, in a first circuit, the cooling medium with electrically insulating properties, in particular a dielectric medium, is used in order to cool the power cell and optionally the further components, wherein, in the second circuit, which can be electrically insulated from the first circuit, a normal coolant, for example water, can be used.

In a schematic partial sectional view, FIG. 1 shows an exemplary power cell 1 of a high-performance inverter according to the prior art with a ceramic heat sink 2. The connections Gate 3, Source 4, and Drain 5 are shown. The semiconductor 6, for example made of SiC, lies on the ceramic heat sink 2, which causes the electrical insulation with rather low thermal conductivity. The thermal conductivity of the ceramic is known to be less than that in the case of a suitable metal. On the rear side of the ceramic heat sink 2, the coolant 7 flows in order to cool the heat sink 2. However, this only performs an indirect cooling of the semiconductor 6, which, however, does not meet the requirements in some high-performance applications. In the case of the high-voltage connection of the semiconductors 6 having voltages>60V, for example 400 V or 800 V or more, the high-voltage side, i.e., the semiconductor 6, is electrically insulated from the coolant 7. Water is used as the coolant 7.

Figure 2:
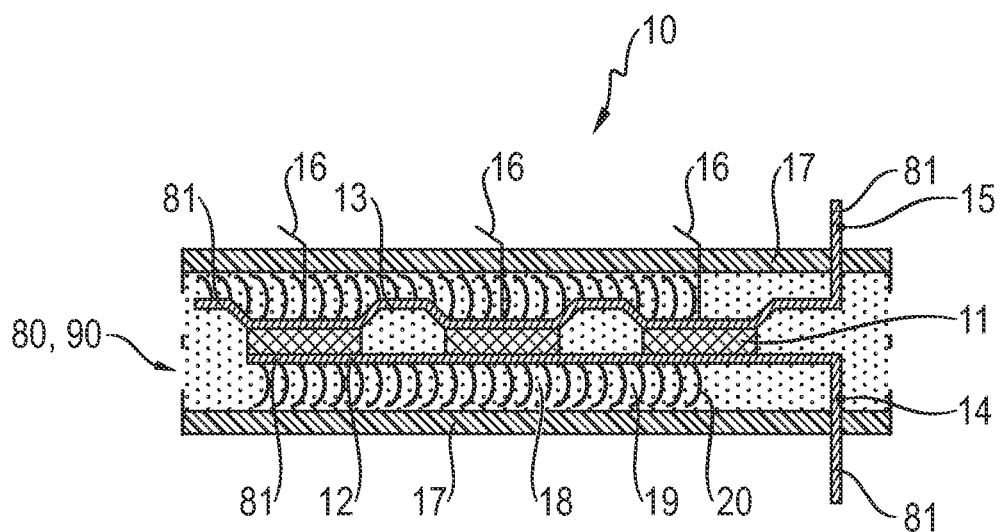
FIG. 2 shows a schematic partial sectional view of a power cell of a cooling arrangement according to an embodiment of the invention.

FIG. 2 shows a schematic partial sectional view of a power cell 10 of a high-power inverter according to an embodiment of the invention. Semiconductors 11 are provided, which are arranged between two sheet elements 12, 13 in an electrically conductive manner. For example, the connection between the semiconductors 11 and the sheets 12, 13 can occur via sintering, etc.

The sheet 12 forms the Drain connection 14 and the sheet 13 forms the Source connection 15. Gate connections 16 are also provided. The arrangement of the sheets 12, 13 and the semiconductor 11 are provided in a plastic wrapping 17, which can be configured as a housing or tube. The sheets 12, 13 also serve directly as heat sinks 2 and absorb heat from the semiconductors 11.

The plastic wrapping 17 has a fluid channel 18 inside, which is perfused by a cooling fluid 19 configured as a cooling medium having electrically insulating properties, in particular as a dielectric medium, in order to be able to insulate electrically.

For example, the sheet 12 can be formed from aluminum and/or copper or such an alloy having aluminum and/or copper and other elements. The sheet 12 can also have structures 20 that improve the heat transfer from the sheet 12 to the cooling fluid 19, for example as ribs, etc. The fluid channel 18 is thus formed and arranged between the sheet 12 and the plastic wrapping 17, for example.

Thus, the power cell 10 can be arranged in the plastic wrapping 17. The cooling fluid 19 perfusing the plastic wrapping 17 can flow up to and/or through the power cell 10 when the power cell 10 itself forms fluid channels.

The cooling arrangement 90 according to an embodiment of the invention for cooling at least one power cell 10, in particular of a motor vehicle, comprises a power cell 10, which is coupled to a cooling fluid circuit 80.

The power cell 10 is directly electrically connected to at least one power conductor 81 of an electrical power supply.

The cooling fluid 19 circulating in the cooling fluid circuit 80 is fluidly connected to the power cell 10 and/or the power conductor 81 so that the cooling fluid 19 can directly flow up to and cool the power cell 10 and/or the power conductor 81.

The cooling fluid 19 is therefore configured as a cooling medium having electrically insulating properties, in particular a dielectric medium.

FIGS. 3 to 6 show various exemplary embodiments of cooling circuits 80 for this purpose.

Figure 3:
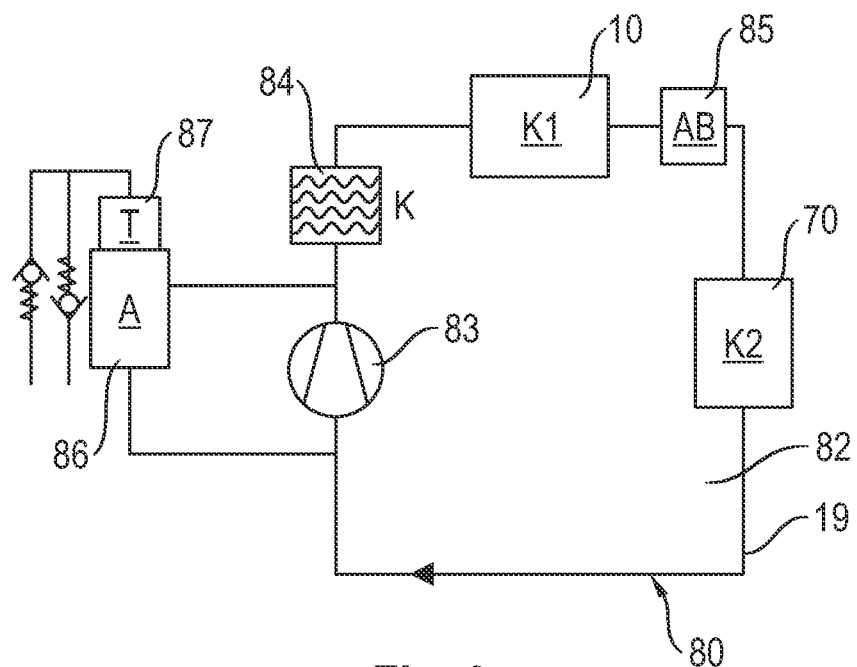
FIG. 3 shows a schematic block diagram view of an exemplary embodiment of a cooling fluid circuit of a cooling arrangement according to the invention.

FIG. 3 shows a cooling fluid circuit 80 comprising a circuit 82 with a pump 83, a radiator 84 for cooling the cooling fluid 19, a separator 85, a reservoir 86, and a dryer 87. The reservoir 86 bridges the pump 83. The radiator 84 is arranged upstream of the power cell 10. The power cell 10 is arranged upstream of the further component 70. The dryer 87 is arranged on the reservoir 86 and advantageously integrated with it or downstream of it.

An exemplary power cell 10 as well as a further component 70, which are connected serially with respect to the fluid flow of the cooling fluid 19, are provided as the components K1, K2 to be cooled. The further component 70 can be, for example, an electric motor, such as an electric machine. A high-voltage battery can also be provided as the further component K2. A plurality of further components K2 can also be provided, i.e., an electric motor and a high-voltage battery, and optionally further components.

FIG. 2 shows that the cooling fluid circuit 80 comprises cooling fluid lines as the plastic wrapping 17, wherein the at least one power conductor 81 is spaced apart from a cooling fluid line, wherein, between the power conductor 81 and the cooling fluid line, there is a perfusable gap for electrical insulation between the power conductor 81 and the cooling fluid line, through which the cooling fluid 19 flows, such that the gap forms a fluid channel 18.

Accordingly, the cooling fluid 19 can flow over and/or through the power cell 10 and/or at least another component T1, T2 to be cooled. This can be advantageously effected when at least one fluid path is provided as a fluid channel 18 in the power cell 10 and/or in the at least one other component T1, T2 to be cooled, which path is perfusable by the cooling fluid 19.

It is advantageous when the fluid path as the fluid channel 19 follows the electrical power path of the power cell 10 and/or the at least one other component T1, T2.

It is preferable when the power cell 10 is a power electronics, in particular for controlling an electric machine, i.e., an electric motor. The electric motor preferably serves as a traction motor of a motor vehicle. An optional other component to be cooled could be, for example, an electric motor and/or a high-voltage battery.

Figure 4:
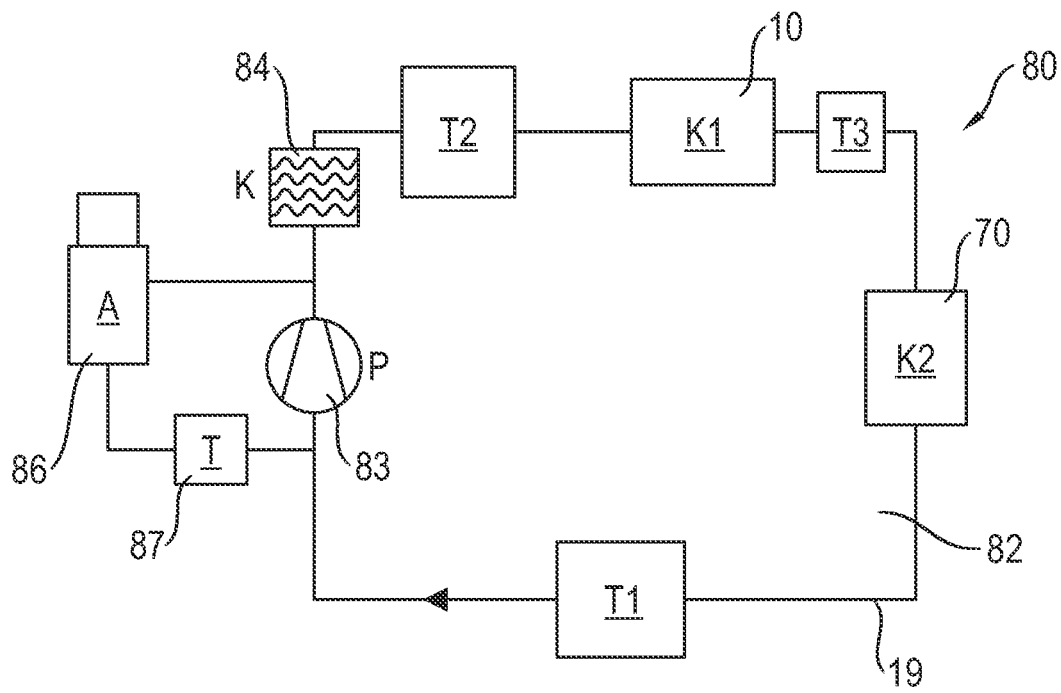
FIG. 4 shows a schematic block diagram view of a second exemplary embodiment of a cooling fluid circuit of a cooling arrangement according to the invention.

FIG. 4 shows an alternative design of a cooling fluid circuit 80 comprising a circuit 82 having a pump 83, a radiator 84 for cooling the cooling fluid 19, a reservoir 86, and a dryer 87. The reservoir 86 bridges the pump 83. The radiator 84 is arranged upstream of the power cell 10. The power cell 10 is arranged upstream of the further component 70. The dryer 87 is arranged upstream of reservoir 86. Alternatively, the dryer 87 can also be arranged at one of the other marked positions T1, T2, or T3 in the circuit 82, i.e., upstream of the power cell 10, see T2, downstream of the power cell 10, see T3, or downstream of the further component 70, see T1.

An exemplary power cell 10 as well as a further component 70, which are connected serially with respect to the fluid flow of the cooling fluid 19, are provided as the components K1, K2 to be cooled. The further component 70 can be, for example, an electric motor, such as an electric machine. A high-voltage battery can also be provided as the further component K2. A plurality of further components K2 can also be provided, for example an electric motor and/or a high-voltage battery and optionally further components.

Figure 5:
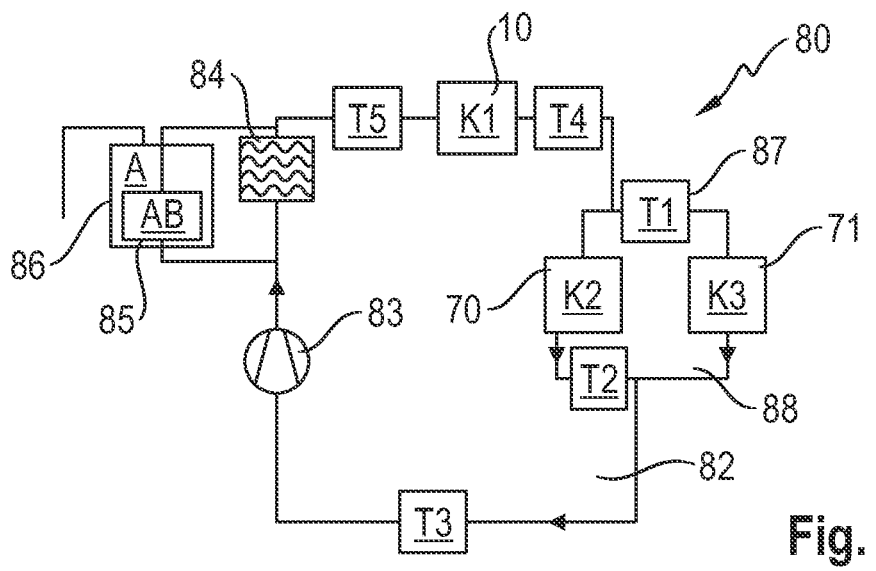
FIG. 5 shows a schematic block diagram view of a third exemplary embodiment of a cooling fluid circuit of a cooling arrangement according to the invention.

FIG. 5 shows an alternative design of a cooling fluid circuit 80 comprising a circuit 82 having a parallel connection 88. The circuit 82 includes a pump 83, a radiator 84 for cooling the cooling fluid 19, a separator 85, a reservoir 86, and a dryer 87. The reservoir 86 bridges the pump 83, wherein the separator 85 is integrated in the reservoir 86.

The radiator 84 is arranged upstream of the power cell 10. The power cell 10 is arranged upstream of the further components 70, 71, which are interconnected in a parallel connection 88. The dryer 87 can be arranged at one of the marked positions T1, T2, T3, T4, or T5 in the circuit 82, i.e., upstream of the power cell 10, see T5, downstream of the power cell 10, see T4, upstream of the component 71, see T1, downstream of the component 70, see T2 or downstream of both further components 70 and 71, see T3.

As the components K1, K2, K3 to be cooled, an exemplary power cell 10 as well as two further components 70, 71 are provided, which are connected serially and in parallel connection 88 with respect to the fluid flow of the cooling fluid 19. For example, the further components 70, 71 can be an electric motor, such as an electric machine, and a high-voltage battery can be provided as the further component K2, K3. A plurality of further components K2, K3, K4, etc. can also be provided, for example an electric motor and/or a high-voltage battery and optionally further components 70, 71.

Figure 6:
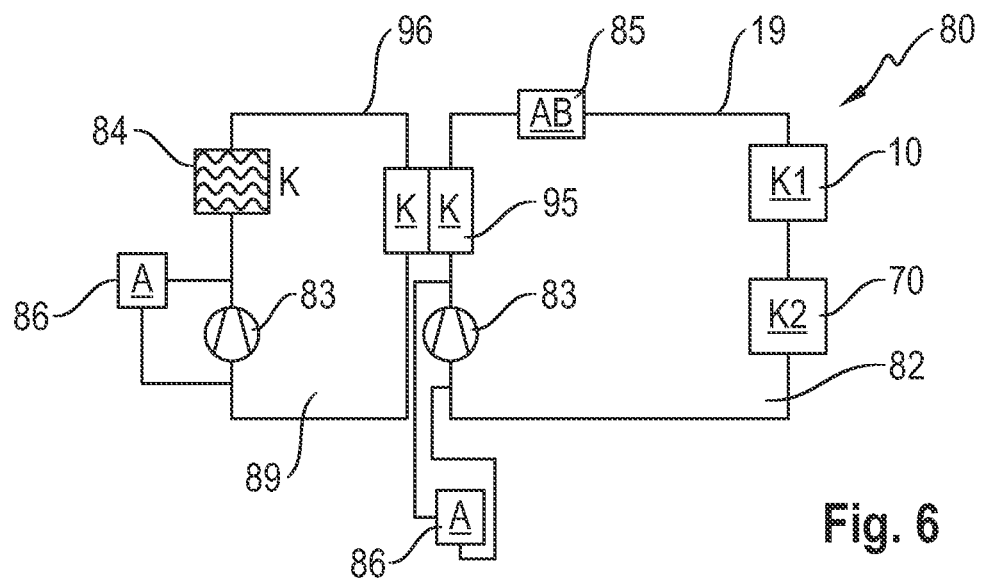
FIG. 6 Shows a schematic block diagram view of a fourth exemplary embodiment of a cooling fluid circuit of a cooling arrangement according to the invention.

The cooling fluid circuit 80 can form a circuit 82, see FIG. 3, 4, or 5, or it can form multiple circuits 82, 89 that are thermally and/or fluidly coupled to one another, see FIG. 6.

FIG. 6 shows that the cooling fluid circuit 80 comprises a first circuit 82 and a second circuit 89. The two circuits 82, 89 are thermally coupled to one another by a second heat exchanger 95 via the fluids that are in heat exchange with one another in the second heat exchanger 95. In the circuit 89, a fluid 96 flows. A radiator 84 for cooling the fluid 96, a pump 83, and an expansion reservoir 86 are provided. In the circuit 82, a pump 83 with a reservoir 86, a separator 85, and the components K1, 10 and K2, 70 to be cooled are provided, which are for example configured as a power cell 10 as well as another component 70. These are connected serially with respect to the fluid flow of the cooling fluid 19. For example, the further component(s) 70 can be an electric motor, such as an electric machine, and/or a high-voltage battery. A plurality of further components K2, K3, K4, etc. can also be provided, for example an electric motor and/or a high-voltage battery and optionally further components.

The power cell 10 and/or the at least one further component 70 or components 70, 71, etc. to be cooled are fluidly connected serially and/or parallel to one another in the at least one circuit 82, 89.

Figure 7:
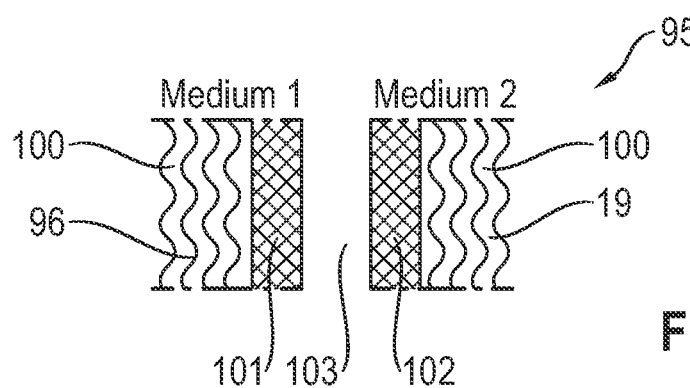
FIG. 7 shows a detail view of the cooling fluid circuit of FIG. 6.

FIG. 7 indicates the fluidic separation of the two fluids 19, 96. In the second heat exchanger 95, fluid channels 100 are respectively provided for the fluids 19, 96, which are separated from one another by seals 101, 102, wherein a leakage channel 103 between the two seals 101, 102 can optionally also be provided.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SYMBOLS

1 Power cell
2 Ceramic heat sink
3 Gate
4 Source
5 Drain
6 Semiconductor
7 Coolant
10 Power cell
11 Semiconductor
12 Sheet metal element
13 Sheet metal element
14 Drain connection
15 Source connection
16 Gate connection
17 Plastic wrapping/Cooling fluid line
18 Fluid channel
19 Cooling fluid
20 Structures
70 Component
71 Component
80 Cooling fluid circuit
81 Power conductor
82 First cooling circuit
83 Pump
84 Radiator
85 Separator
86 Reservoir
87 Dryer
88 Parallel connection
89 Second circuit
90 Cooling arrangement
95 Heat exchanger
96 Fluid
100 Fluid channel
101 Seal
102 Seal
103 Leakage channel

The invention claimed is:

1. A cooling arrangement for cooling at least one power cell of a motor vehicle, the cooling arrangement comprising:
a power cell; and
a cooling fluid circuit,
wherein the power cell is directly electrically connected to at least one power conductor of an electric power supply,
wherein a cooling fluid is configured to circulate in the cooling fluid circuit,
wherein the cooling fluid circuit is fluidly connected to the power cell and/or the at least one power conductor,
wherein at least one fluid path of the cooling fluid circuit is provided in the power cell, which path is perfusable by the cooling fluid,
wherein the at least one fluid path follows an electrical power path between the power cell and at least one other component to be cooled, and
wherein the cooling fluid is a cooling medium having electrically insulating properties,
wherein the power cell comprises a conductive sheet in thermal contact with a conductive structure,
wherein the cooling fluid circuit comprises a cooling fluid line,
wherein the at least one power conductor enters the cooling fluid line through a wall of the cooling fluid line and electrically connects to the conductive sheet,
wherein the conductive sheet is arranged within the cooling fluid line and spaced apart from the wall of the cooling fluid line,
wherein a perfusable gap is formed between the conductive sheet and the wall of the cooling fluid line for electrical insulation between the conductive sheet and the wall of the cooling fluid line, through which perfusable gap the cooling fluid flows,
wherein a second power conductor of the at least one power conductor enters the cooling fluid line through an opposite side of the wall of the cooling fluid line from which the at least one power conductor enters and electrically connects to a second conductive sheet in thermal contact with the conductive structure,
wherein the second conductive sheet is arranged within the cooling fluid line and spaced apart from the opposite side of the wall of the cooling fluid line, and
wherein a second perfusable gap is formed between the second conductive sheet and the opposite side of the wall of the cooling fluid line for electrical insulation between the second conductive sheet and the wall of the cooling fluid line, through which the second perfusable gap the cooling fluid flows.

2. The cooling arrangement according to claim 1, wherein the at least one power conductor is spaced apart from the cooling fluid line, and
wherein the perfusable gap is formed between the at least one power conductor and the cooling fluid line for electrical insulation between the at least one power conductor and the cooling fluid line, through which gap the cooling fluid flows.

3. The cooling arrangement according to claim 1, wherein the at least one power conductor forms a heat sink for at least one incorporated switching element of the power cell.

4. The cooling arrangement according to claim 1, wherein the cooling fluid is configured to flow over and/or through the power cell and/or the at least one other component to be cooled.

5. The cooling arrangement according to claim 4, wherein at least one further fluid path is provided in the at least one other component to be cooled, which at least one further fluid path is perfusable by the cooling fluid.

6. The cooling arrangement according to claim 5, wherein the at least one further fluid path follows an electrical power path of the at least one other component.

7. The cooling arrangement according to claim 1, wherein the power cell comprises power electronics.

8. The cooling assembly according to claim 1, wherein the cooling fluid circuit forms a circuit or a plurality of circuits that are thermally and/or fluidly coupled to one another.

9. The cooling arrangement according to claim 8, wherein the cooling fluid circuit comprises a pump and a first heat exchanger as a radiator for the cooling fluid.

10. The cooling arrangement according to claim 8, wherein the power cell and/or the at least one other component to be cooled are fluidly connected serially and/or parallel to one another in the at least one circuit.

11. The cooling arrangement according to claim 8, wherein the thermally coupled circuits are coupled by a second heat exchanger.

12. The cooling arrangement according to claim 4, wherein the at least one other component is an electric motor and/or a high voltage battery.

13. The cooling arrangement according to claim 9, wherein the cooling fluid circuit comprises a reservoir, a dryer, and/or a separator.

14. The cooling arrangement according to claim 1, wherein the cooling medium includes a dielectric medium.

15. The cooling arrangement according to claim 1, wherein the wall of the cooling fluid line comprises a plastic wrapping.

* * * * *